(12) United States Patent
Ju

(10) Patent No.: US 7,172,448 B2
(45) Date of Patent: Feb. 6, 2007

(54) ELECTRICAL CONNECTOR

(76) Inventor: Ted Ju, No. 15, Wu Shiun St., An-Lo Dist., Keelung City (TW)

( * ) Notice: Subject to any disclaimer, the term of this patent is extended or adjusted under 35 U.S.C. 154(b) by 0 days.

(21) Appl. No.: 11/262,717

(22) Filed: Nov. 1, 2005

(65) Prior Publication Data

US 2006/0128201 A1    Jun. 15, 2006

(30) Foreign Application Priority Data

Dec. 15, 2004   (CN) .................. 2004 2 0102448

(51) Int. Cl.
*H01R 13/62*    (2006.01)
(52) U.S. Cl. .................................... 439/331
(58) Field of Classification Search ................ 439/331, 439/342, 525, 73
See application file for complete search history.

(56) References Cited

U.S. PATENT DOCUMENTS 6,471,536 B1 *  10/2002  Chen et al. ................. 439/342
6,648,656 B1 *  11/2003  Ma ............................. 439/73
7,029,309 B2 *   4/2006  Ma ............................ 439/331

* cited by examiner

*Primary Examiner*—Alexander Gilman
(74) *Attorney, Agent, or Firm*—Rosenberg, Klein & Lee

(57) ABSTRACT

An electrical connector is used for electrically connecting a plane grid array chip module to a circuit board. The electrical connector includes an insulating body, and conducting pins located in the insulating body. One side of the insulating body includes a fastening body that can be separated from the insulating body. The fastening body is pivoted with a cover body that can press the chip module to make the chip module be electrically connected with the conducting pin. The opposite side of the insulating body includes a fastening device for fastening the cover body. The electrical connector doesn't need a lower metal shell. The electrical connector utilizes the fastening body and the fastening device to fasten the cover body and the insulating body. Therefore, the goals of needing less material, being easily manufactured, and reducing the cost of the electrical connector are achieved.

4 Claims, 7 Drawing Sheets

ELECTRICAL CONNECTOR

BACKGROUND OF THE INVENTION

1. Field of the Invention

The present invention relates to an electrical connector. In particular, an electrical connector is used for connecting a plane grid array chip module to a circuit board.

2. Description of the Related Art

Due to the integrated application of the system technology for multi-medium, communication, and computer, the function of the desktop computers or laptops becomes more and more powerful and the circuit of the motherboard becomes complex. Especially in the laptops, in order to receiving more elements in the limited space, the design and the arrangement for the elements on the motherboard become more and more important.

Currently, the chip module is electrically connected to the circuit board via an electrical connector. Please refer to FIGS. 1 and 2. The electrical connector is used for electrically connecting the chip module 500 to the circuit board 600. The electrical connector includes an upper metal shell 100 and a lower metal shell 200 that are movably connected together. A rod 300 is used for fastening the upper metal shell 100 and the lower metal shell 200 together. A body 400 is located in the lower metal shell 200 and is used for supporting the chip module 500. However, the manufacturing process for the lower metal shell 200 is complex and needs more raw materials. Therefore, the cost is high.

SUMMARY OF THE INVENTION

One particular aspect of the present invention is to provide an electrical connector. The electrical connector of the present invention needs less material, is easily manufactured, and reduces the cost of the electrical connector.

The electrical connector of the present invention is used for connecting a plane grid array chip module to a circuit board. The electrical connector includes an insulating body, and conducting pins located in the insulating body. One side of the insulating body includes a fastening body that can be separated from the insulating body. The fastening body is pivoted with a cover body that can press the chip module to make the chip module be electrically connected with the conducting pin. The opposite side of the insulating body includes a fastening device for fastening the cover body.

The electrical connector doesn't need a lower metal shell. The electrical connector utilizes the fastening body and the fastening device to fasten the cover body and the insulating body. Therefore, the goals of needing less material, being easily manufactured, and reducing the cost of the electrical connector are achieved.

For further understanding of the invention, reference is made to the following detailed description illustrating the embodiments and examples of the invention. The description is only for illustrating the invention and is not intended to be considered limiting of the scope of the claim.

BRIEF DESCRIPTION OF THE DRAWINGS

The drawings included herein provide a further understanding of the invention. A brief introduction of the drawings is as follows:

FIG. 4A is a detailed view of the part A of FIG. 4;

DETAILED DESCRIPTION OF THE PREFERRED EMBODIMENTS

Figure 1:
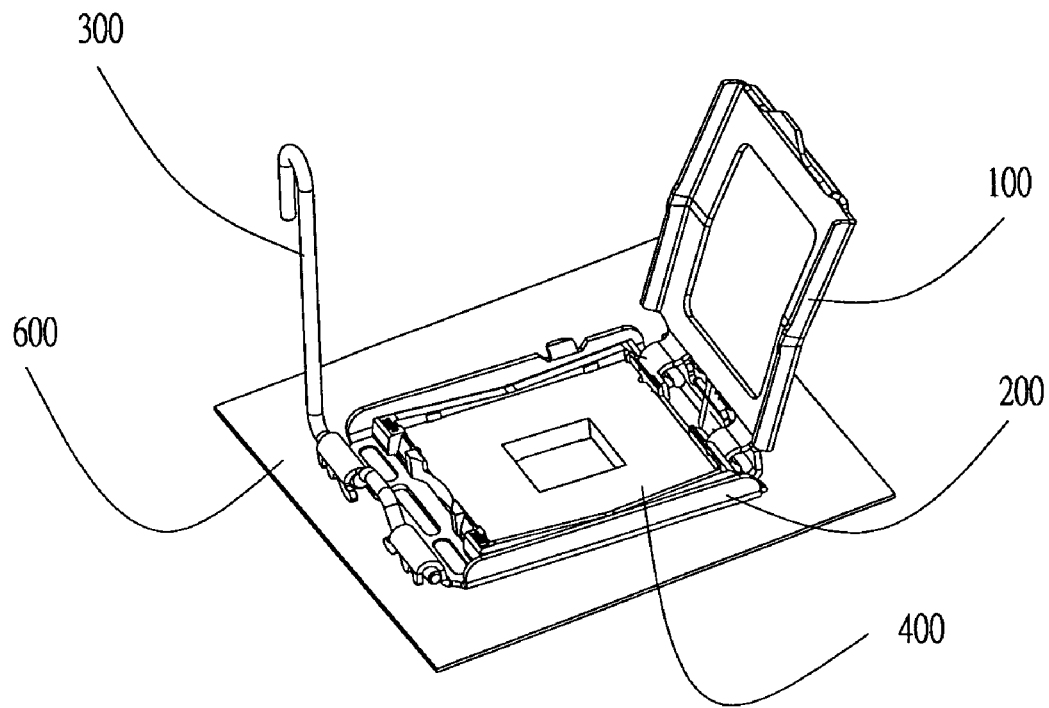
FIG. 1 is a perspective view of the electrical connector of the prior art.
Figure 2:
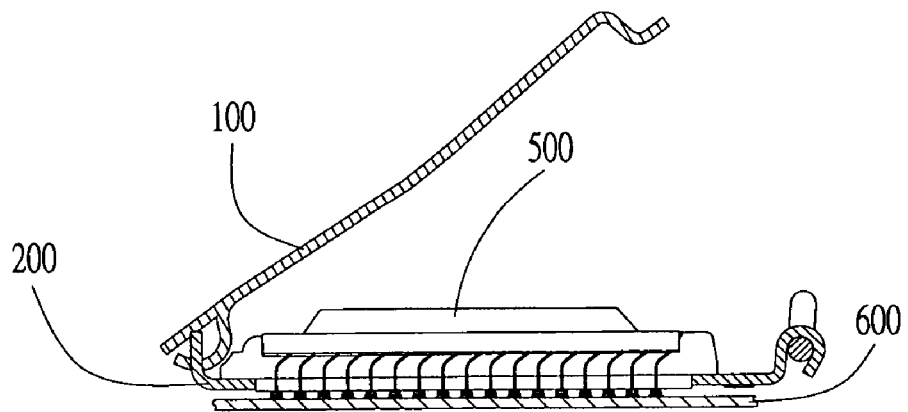
FIG. 2 is a side view of the electrical connector of the prior art.
Figure 3:
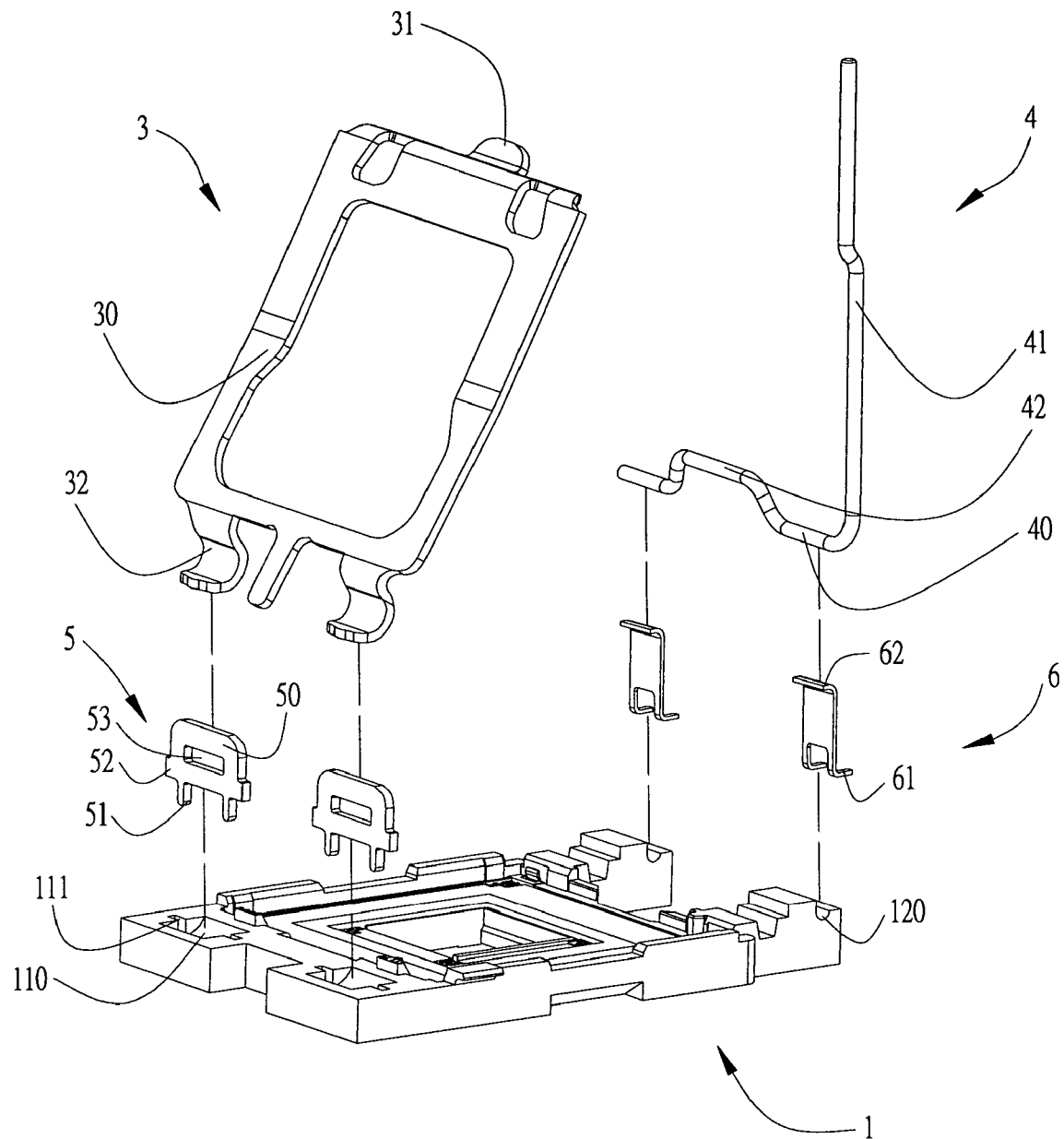
FIG. 3 is an exploded perspective view of the electrical connector of the present invention.
Figure 4:
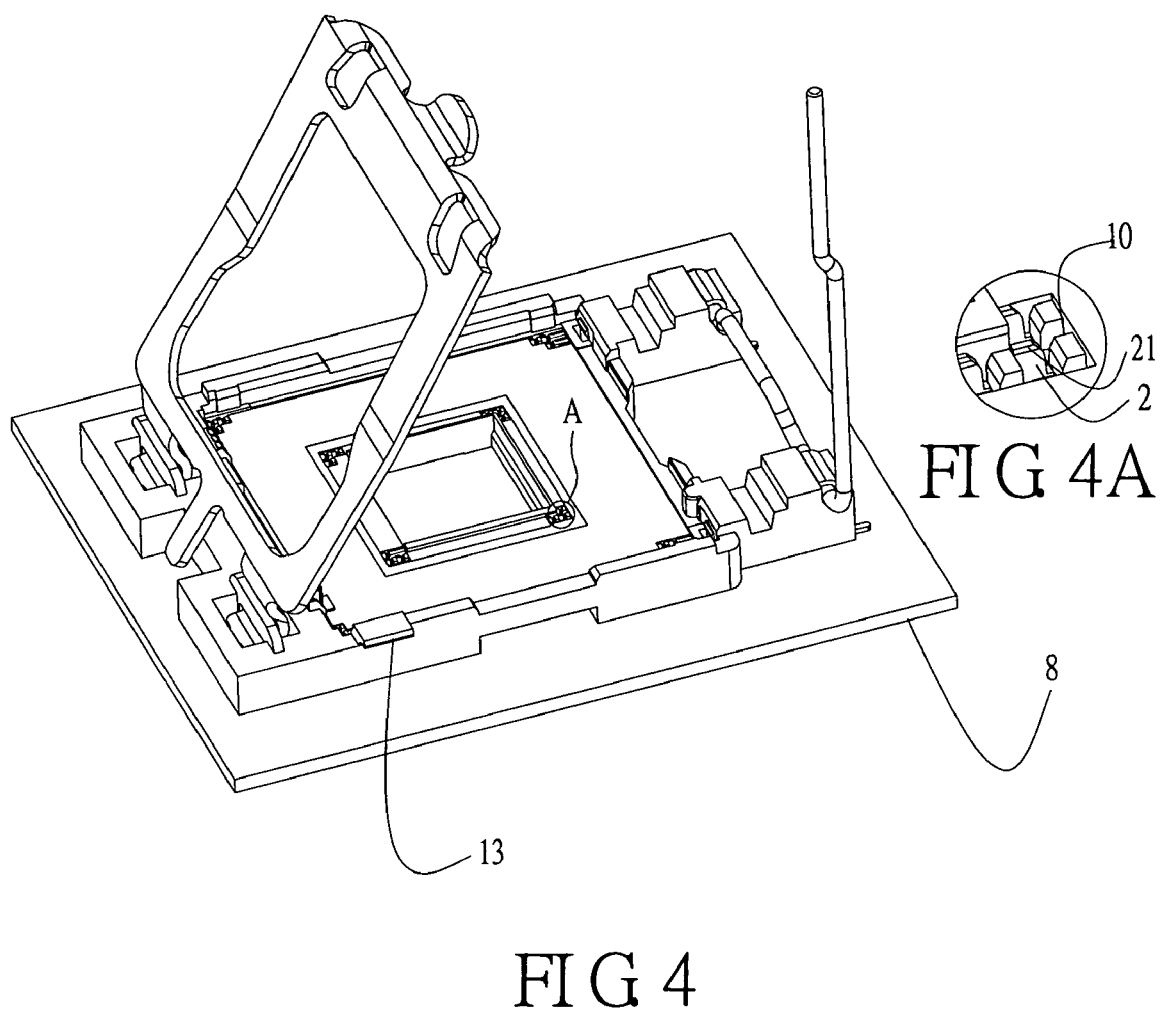
FIG. 4 is a perspective view of the electrical connector of the present invention connected with the circuit board.
Figure 5:
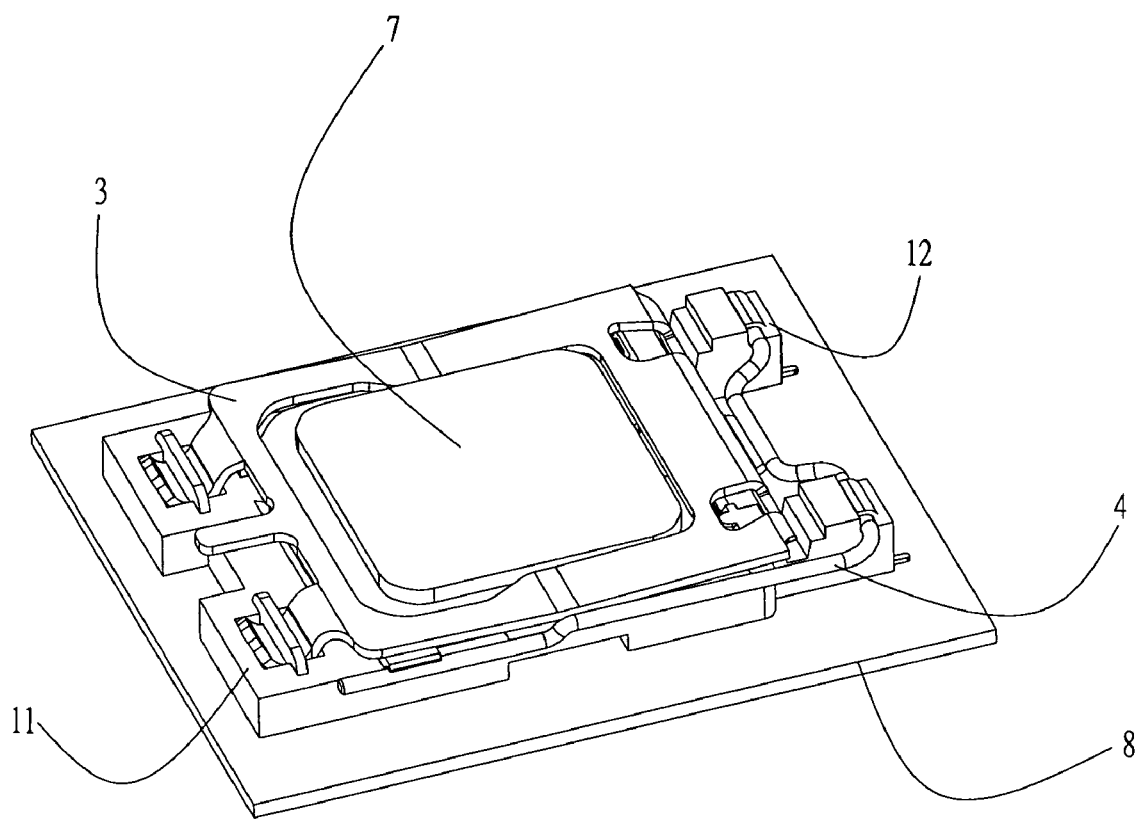
FIG. 5 is a perspective view of the electrical connector of the present invention and the chip module connected with the circuit board.
Figure 6:
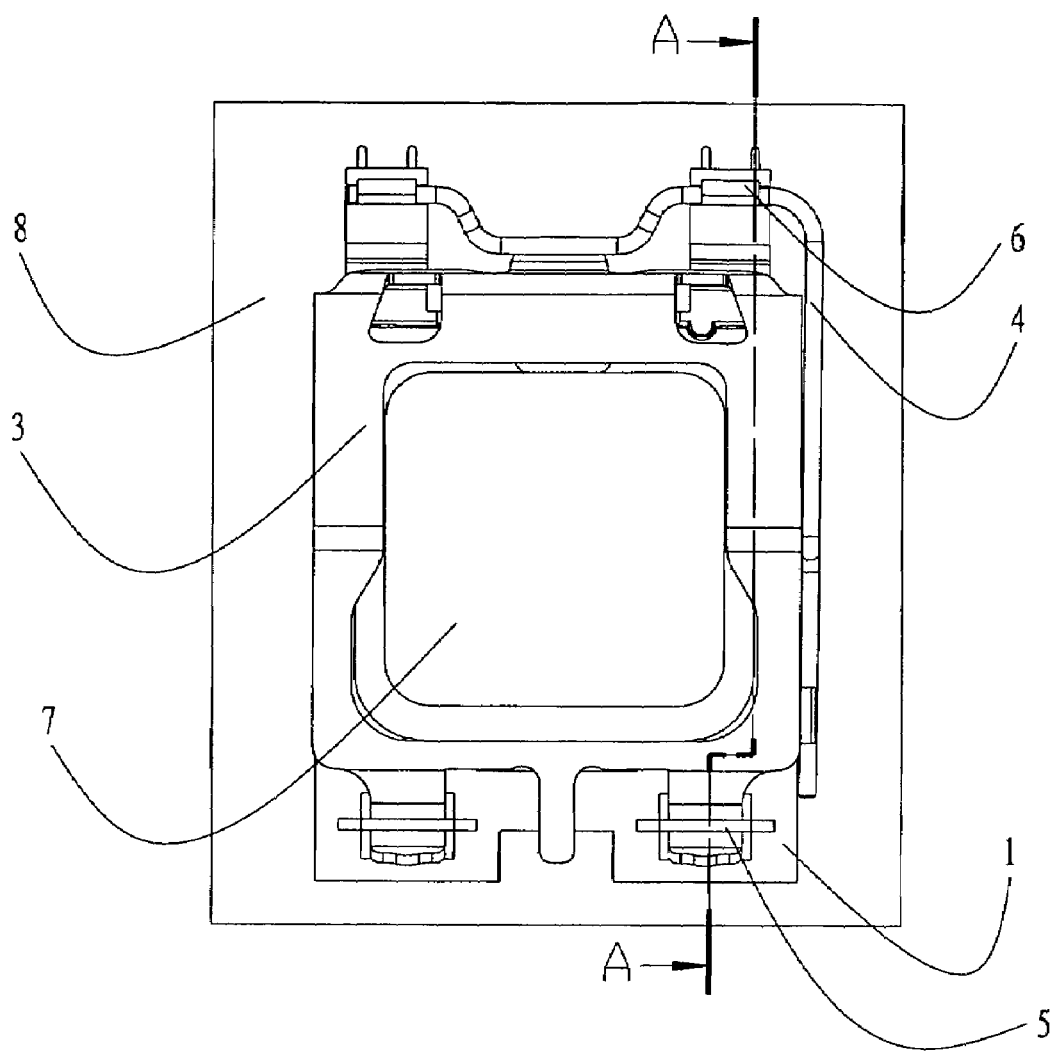
FIG. 6 is a top view of FIG. 5.
Figure 7:
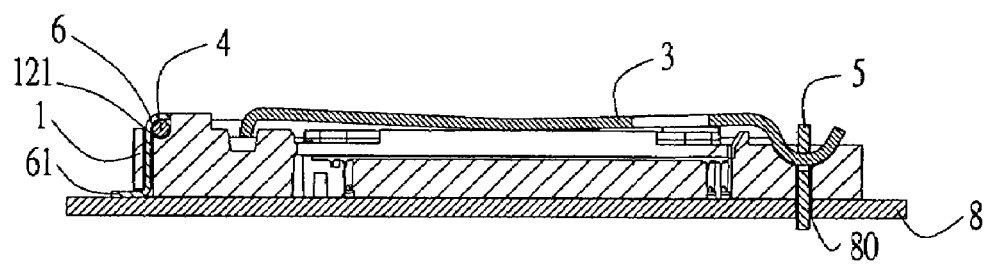
FIG. 7 is a cross-sectional view in the A—A direction of FIG. 6.

Please refer to FIGS. 3~7. The present invention provides an electrical connector. The electrical connector of the present invention is used for connecting a plane grid array chip module 7 to a circuit board 8. The electrical connector includes an insulating body 1, conducting pins 2 located in the insulating body 1, a cover body 3, a fastening body 5 and a fastening device. The fastening device includes a rod 4 and a fastening flake 6.

The insulating body 1 has a plurality of receiving holes 10. On the border of the receiving hole 10, there are a first positioning side block 11 and a second positioning side block 12 that are higher than the receiving hole 10. The conducting pins 2 are received in the receiving holes 10. At least one end of the conducting pin 2 is higher than the receiving hole 10 of the insulating body 1, and the conducting pin 2 has a bend-shape and is formed a contacting end 21 for pressing and contacting with the plane grid array chip module 7. The highest point of the conducting pin 2 is lower than the upper surface of the first positioning side block 11 and the second positioning side block 12. The lower end (not shown in the figure) of the conducting pin 2 can be welded to the upper surface of the circuit board 8. The first positioning side block 11 has an opening 110. The opening 110 passes through the upper and lower surfaces of the first positioning side block 11. The opposite two sides of the opening 110 individually have a holding slot 111 that is concaved for connecting with the fastening body 5. On the upper surface of the second positioning side block 12, there is a receiving slot 120. The receiving slot 120 includes a through hole 121 for being plugged by the fastening flake 6. One side of the insulating body 1 outward protrudes a convex block 13.

The cover body 3 has a frame-shape and includes a main body part 30, a pressing part 31 extended from the one side of the main body part 30, and a pivoting part 32 extended from the opposite side of the main body part 30.

The rod 4 includes a shaft part 40, an operation part 41 being vertical to the shaft part 40, and a pressing part 42 extended from the shaft part 41 inward.

The fastening body 5 can be plugged into the opening 110 of the insulating body 1 and has a slice-shape. The fastening body 5 includes a base part 50, a welding part 51 extended from the base part 50 downward, and a holding part 52 extended from the two sides of the base part 50 outward. The welding part 51 stretches out of the lower surface of the insulating body 1, stretches into a corresponding hole 80 on the circuit board 8, and is welded with circuit board 8. The holding part 52 is located in the holding slot 111. On the base part 50, there is a hole 53 for connecting with the pivoting part 32 of the cover body 3.

The fastening flake 6 can be plugged into the receiving slot 120 of the insulating body 1 and has a slice-shape. The fastening flake 6 includes a fastening part 61 and a positioning part 62. The positioning part 62 has an inward-bent shape for pressing and holding the shaft part 40 of the rod 4. The fastening part 61 stretches out of the lower surface of the insulating body 1, the end of the fastening part 61 has a horizontal shape, and can be welded on the surface of the circuit board 8. The positioning part 62 is fitting with the inner surface of the receiving slot 120.

When the electrical connector is assembled, the pivoting part 32 of the cover body 3 and the hole 53 of the fastening body 5 are jointed together, and then are connected with the insulating body 1. The shaft part 40 of the rod 4 is located at the space formed by the positioning part 62 of the fastening flake 6 and the receiving slot 120 of the insulating body 1. The chip module 7 is located on the insulating body 1, and the cover body 3 is pressed and located on the upper surface of the chip module 7. The operation part 41 of the rod 4 is operated to make the pressing part 42 of the rod 4 press on the pressing part 31 of the cover body 3 and make the operation part 41 be located under the convex block 13 of the insulating body 1. Therefore, the chip module 7 is electrically connected with the conducting pin 2.

Figure 8:
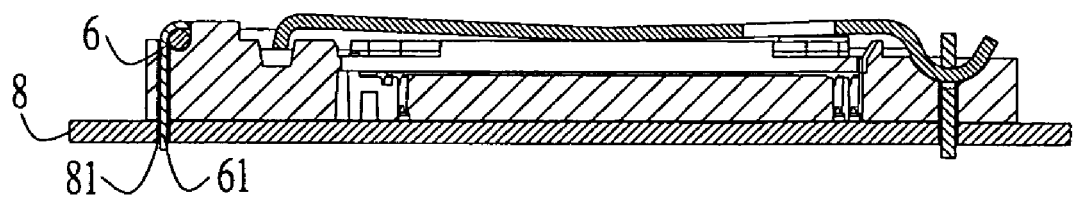
FIG. 8 is a schematic diagram of a second embodiment of the electrical connector of the present invention.
Figure 9:
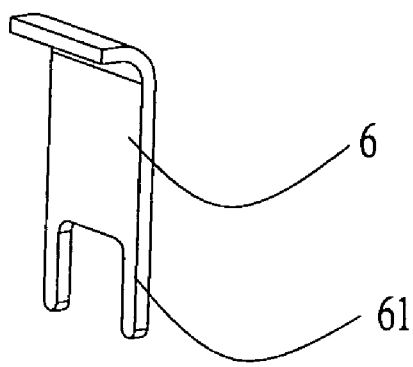
FIG. 9 is a perspective view of the second fastening flake shown in the FIG. 8.

FIG. 8 and FIG. 9 show a second embodiment of the electrical connector of the present invention. The difference with the first embodiment is the end of the fastening part 61 of the fastening flake 6 has an upright shape, can be plugged into the corresponding through hole 81 of the circuit 8 and is welded with the circuit board 8.

Figure 10:
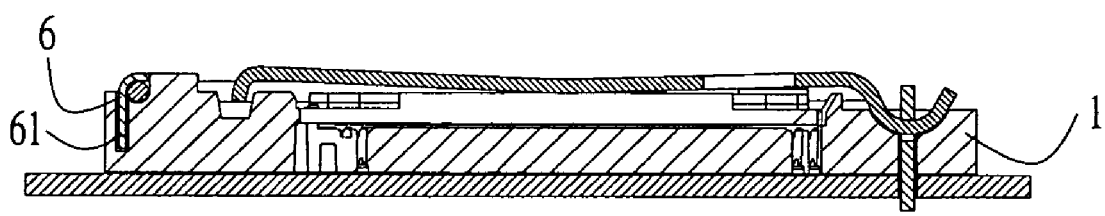
FIG. 10 is a schematic diagram of a third embodiment of the electrical connector of the present invention.

FIG. 10 shows a third embodiment of the electrical connector of the present invention. The difference with the second embodiment is the end of the fastening part 61 of the fastening flake 6 does not stretch out the lower surface of the insulating body 1, and is not welded with the circuit board 8. Its effect is the same as the second embodiment.

Figure 11:
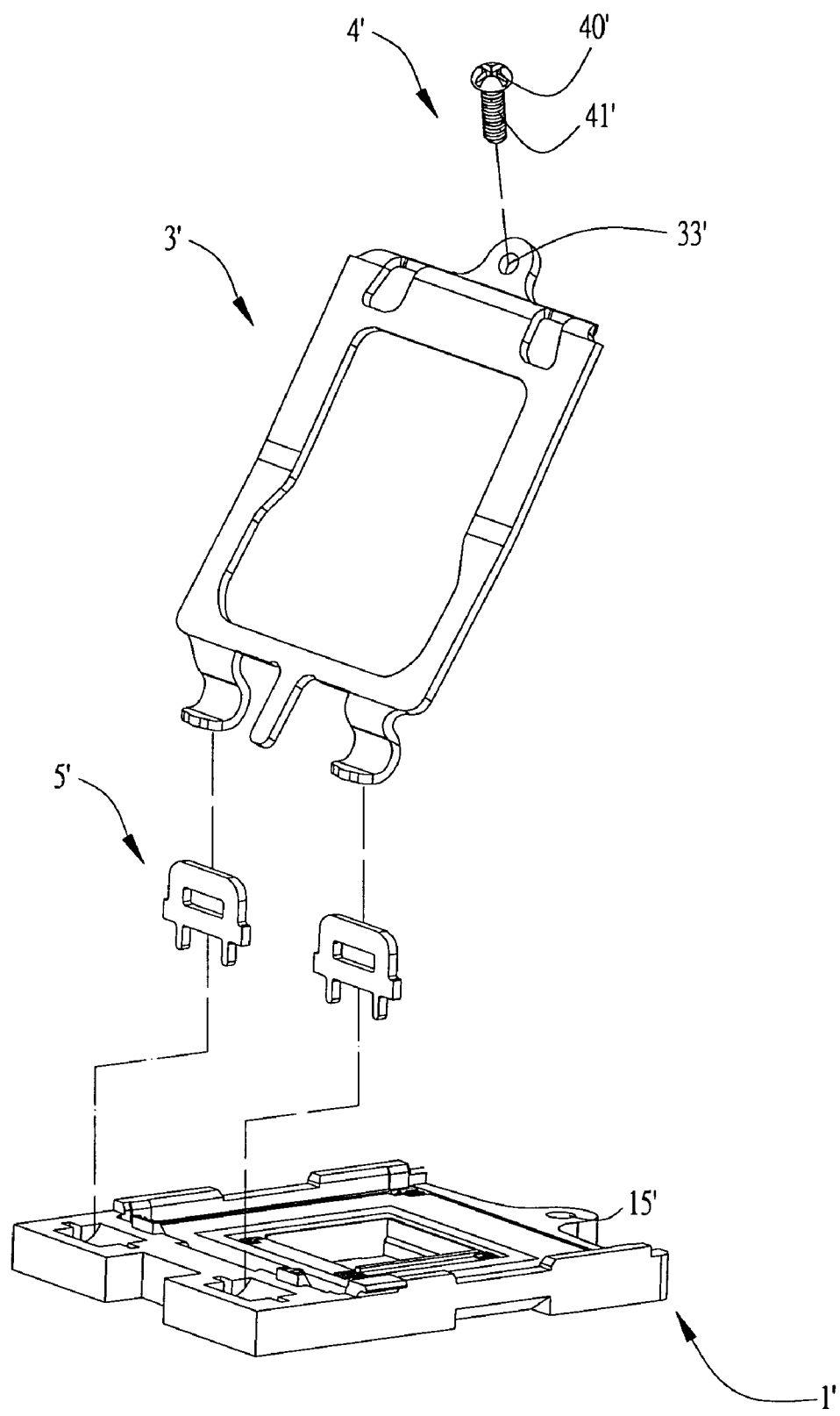
FIG. 11 is a schematic diagram of a fourth embodiment of the electrical connector of the present invention.

FIG. 11 shows a fourth embodiment of the electrical connector of the present invention. The difference with the previous embodiments is the fastening device is a screw 4'. The screw 4' includes a head part 40' and a connecting part 41'. At one end of the insulating body 1' having a fastening body 5' there is a screw hole 15'. The screw hole 15' passes through the upper and lower surface of the insulating body 1'. On the cover body 3' there a though hole 33' that corresponds to the screw hole 15' on the insulating body 1'. The connecting part 41' of the screw 4' passes through the through hole 33' but the head part 42' cannot pass through the through hole 33'. When the chip module (not shown in the figure) is connected, the chip module is directly placed on the insulating body 1' and contacts with the conducting pin (not shown in the figure). Then, the cover body 3' is pressed, and the screw 4' passes through the through hole 33' and is locked into the screw hole 15' of the insulating body 1'. Therefore, the cover body 3' is fastened to the insulating body 1'.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An electrical connector connecting a plane grid array chip module to a circuit board, the electrical connector comprising:

an insulating body including at least a pair of openings formed at one end thereof, each of said at least a pair of openings being shaped to form holding slots extending through said insulating body, conducting pins being located in the insulating body;

at least a pair of fastening bodies, each fastening body being removably received in a respective one of said at least pair of openings of said insulating body, said each fastening body including a base part, a holding part connected to said base part, and a welding part extending from said holding part, a hole being defined between said base and holding parts, said welding part extending through a respective one of said holding slots below the bottom of the insulating body, and further extending into an opening formed in the circuit board in alignment with said respective holding slot to be welded therein to the circuit board;

a cover body pivotally coupled to said at least a pair of fastening bodies, said cover body having at least a pair of pivoting parts arranged at an end of said cover body corresponding to said one end of said insulating body, each of said at least a pair of pivoting parts extending through said hole of a respective one of said at least a pair of fastening bodies, thereby resulting in a pivoting coupling between said cover body and said insulating body at respective ends thereof, the chip module being sandwiched between said insulating body and said cover body to attain electrical connection of the chip module with the conducting pins; and a fastening device located at an opposite end of said insulating body for fastening the cover body thereto.

2. The electrical connector as claimed in claim 1, wherein the fastening device comprises a fastening flake and a rod; wherein the rod comprises a shaft part, an operation part being vertical to the shaft part, and a pressing part extended from the shaft part inward and pressing the cover body towards the insulating body; wherein the fastening flake is located at the opposite end of the insulating body, and comprises a fastening part fastened on the insulating body or the circuit board, and a positioning part engaging the shaft part of the rod.

3. The electrical connector as claimed in claim 1, wherein the fastening device comprises a screw, a corresponding screw hole formed on the opposite end of said insulating body, and a through hole formed on the cover body in alignment with the screw hole, the screw passing through the through hole of the cover body to be locked into the screw hole of the insulating body to fasten the cover body to the insulating body.

4. The electrical connector as claimed in claim 1, wherein the insulating body comprises a plurality of receiving holes and a plurality of positioning side blocks that are higher than the receiving hole; wherein the conducting pins are located in the receiving holes, at least one end of the conducting pin being higher than the receiving hole of the insulating body, the conducting pin being of a bend-shape and having a contacting end, and wherein the highest point of the conducting pin is lower than the upper surface of the positioning side block.

* * * * *